United States Patent
Sethi et al.

(10) Patent No.: US 12,346,233 B2
(45) Date of Patent: Jul. 1, 2025

(54) PREDICTING USAGE OF SYSTEM STATE INFORMATION TO DETERMINE COMPRESSION LEVELS

(71) Applicant: Dell Products L.P., Round Rock, TX (US)

(72) Inventors: Parminder Singh Sethi, Ludhiana (IN); Lakshmi Saroja Nalam, Bangalore (IN); Atishay Jain, Meerut (IN)

(73) Assignee: Dell Products L.P., Round Rock, TX (US)

( * ) Notice: Subject to any disclaimer, the term of this patent is extended or adjusted under 35 U.S.C. 154(b) by 669 days.

(21) Appl. No.: 17/569,266

(22) Filed: Jan. 5, 2022

(65) Prior Publication Data
US 2023/0214309 A1 Jul. 6, 2023

(51) Int. Cl.
*G06F 9/44* (2018.01)
*G06F 11/30* (2006.01)
*G06F 11/34* (2006.01)
*G06N 20/20* (2019.01)
*H03M 7/30* (2006.01)

(52) U.S. Cl.
CPC ...... *G06F 11/3442* (2013.01); *G06F 11/3034* (2013.01); *G06N 20/20* (2019.01); *H03M 7/60* (2013.01)

(58) Field of Classification Search
CPC .................................................. G06F 11/3442
USPC ........................................................ 718/104
See application file for complete search history.

(56) References Cited

U.S. PATENT DOCUMENTS

2021/0374587 A1* 12/2021 Gambetta ............... H03M 7/70
2022/0179757 A1* 6/2022 Degaonkar ......... G06F 11/1464
2022/0417540 A1* 12/2022 Adzic .................... G06V 20/46

OTHER PUBLICATIONS

D. Berrar, "Bayes' Theorem and Naive Bayes Classifier," Encyclopedia of Bioinformatics and Computational Biology, vol. 1, Jan. 2018, 18 pages.
Wikipedia, "Residual Sum of Squares," https://en.wikipedia.org/w/index.php?title=Residual_sum_of_squares&oldid=1034484424, Jul. 20, 2021, 3 pages.
CSU Long Beach PPA 696 Research Methods, "Simple Regression," https://home.csulb.edu/~msaintg/ppa696/696regs.htm, Accessed Dec. 28, 2021, 5 pages.
U.S. Appl. No. 17/380,187 filed in the name of Parminder Singh Sethi et al. Jul. 20, 2021, and entitled "Determining Compression Levels to Apply for Different Logical Chunks of Collected System State Information."

* cited by examiner

*Primary Examiner* — Timothy A Mudrick
(74) *Attorney, Agent, or Firm* — Ryan, Mason & Lewis, LLP

(57) ABSTRACT

An apparatus comprises a processing device configured to receive system state information corresponding to one or more devices, to predict a usage frequency of the system state information using one or more machine learning models, and to determine, based at least in part on the usage frequency, a compression level for storage of the system state information. The compression level is applied to the system state information to generate at least one compressed file for transmission to a database.

20 Claims, 15 Drawing Sheets

| Device Type | Component Type | Alert Type | Collection Type | Case open date | Case reopen date | Case reopen times | Usage Frequency (Percentage) |
|---|---|---|---|---|---|---|---|
| Type A | HDD | Critical | Alert based Collection | 8/18/2020 | 8/19/2020 | 2 | 80 |
| Type A | HDD | Warning | Alert based Collection | 8/27/2020 | 8/29/2020 | 1 | 70 |
| Type B | CPU | Warning | Alert based Collection | 8/29/2020 | 10/25/2020 | 1 | 70 |
| Type B | Memory | Critical | Alert based Collection | 9/3/2020 | 10/17/2020 | 1 | 40 |
| Type C | Memory | Warning | Alert based Collection | 9/9/2020 | 8/13/2020 | 2 | 70 |
| Type C | CPU | Critical | Alert based Collection | 10/17/2020 | 8/18/2020 | 1 | 90 |
| Type D | Keyboard | Regular | On Demand | 10/18/2020 | NA | 0 | 60 |
| Type E | Mouse | Regular | Periodic based collection | 10/25/2020 | NA | 0 | 30 |

FIG. 3

| Device Type | Component Type | Alert Type | Collection Type | Case open date | Case reopen date | Case reopen times | Observed Usage Frequency (Percentage) | Initial Predicted Usage Frequency (Percentage) | Pseudo Residual (Observed – Predicted) |
|---|---|---|---|---|---|---|---|---|---|
| Type A | HDD | Critical | Alert based Collection | 8/18/2020 | 8/19/2020 | 2 | 80 | 64 | 16 |
| Type A | HDD | Warning | Alert based Collection | 8/27/2020 | 8/29/2020 | 1 | 70 | 64 | 6 |
| Type B | CPU | Warning | Alert based Collection | 8/29/2020 | 10/25/2020 | 1 | 70 | 64 | 6 |
| Type B | Memory | Critical | Alert based Collection | 9/3/2020 | 10/17/2020 | 1 | 40 | 64 | -24 |
| Type C | Memory | Warning | Alert based Collection | 9/9/2020 | 8/13/2020 | 2 | 70 | 64 | 6 |
| Type C | CPU | Critical | Alert based Collection | 10/17/2020 | 8/18/2020 | 1 | 90 | 64 | 26 |
| Type D | Keyboard | Regular | On Demand | 10/18/2020 | NA | 0 | 60 | 64 | -4 |
| Type E | Mouse | Regular | Periodic based collection | 10/25/2020 | NA | 0 | 30 | 64 | -34 |

FIG. 5

| Component Type | Pseudo Residual |
|---|---|
| HDD | 16 |
| HDD | 6 |
| CPU | 6 |
| Memory | -24 |
| Memory | 6 |
| CPU | 26 |
| Keyboard | -4 |
| Mouse | -34 |

| Alert Type | Pseudo Residual |
|---|---|
| Critical | 16 |
| Warning | 6 |
| Warning | 6 |
| Critical | -24 |
| Warning | 6 |
| Critical | 26 |
| Regular | -4 |
| Regular | -34 |

| Collection Type | Pseudo Residual |
|---|---|
| Alert based Collection | 16 |
| Alert based Collection | 6 |
| Alert based Collection | 6 |
| Alert based Collection | -24 |
| Alert based Collection | 6 |
| Alert based Collection | 26 |
| On Demand | -4 |
| Periodic based collection | -34 |

| Case reopen times | Pseudo Residual |
|---|---|
| 2 | 16 |
| 1 | 6 |
| 1 | 6 |
| 1 | -24 |
| 2 | 6 |
| 1 | 26 |
| 0 | -4 |
| 0 | -34 |

| Component Type | Pseudo Residual |
|---|---|
| CPU | 6 |
| CPU | 26 |
| HDD | 6 |
| HDD | 16 |
| Keyboard | -4 |
| Memory | -24 |
| Memory | 6 |
| Mouse | -34 |

| Case reopen times | Pseudo Residual |
|---|---|
| 0 | -34 |
| 0 | -4 |
| 1 | -24 |
| 1 | 6 |
| 1 | 6 |
| 1 | 26 |
| 2 | 6 |
| 2 | 16 |

FIG. 8

| Device Type | Component Type | Alert Type | Collection Type | Case open date | Case reopen date | Case reopen times | Observed Usage Frequency (Percentage) | Updated Predicted Usage Frequency (Percentage) |
|---|---|---|---|---|---|---|---|---|
| Type A | HDD | Critical | Alert based Collection | 8/18/2020 | 8/19/2020 | 2 | 80 | 75.5 |
| Type A | HDD | Warning | Alert based Collection | 8/27/2020 | 8/29/2020 | 1 | 70 | 65 |
| Type B | CPU | Warning | Alert based Collection | 8/29/2020 | 10/25/2020 | 1 | 70 | 65.3 |
| Type B | Memory | Critical | Alert based Collection | 9/3/2020 | 10/17/2020 | 1 | 40 | 36.4 |
| Type C | Memory | Warning | Alert based Collection | 9/9/2020 | 8/13/2020 | 2 | 70 | 65.9 |
| Type C | CPU | Critical | Alert based Collection | 10/17/2020 | 8/18/2020 | 1 | 90 | 75.3 |
| Type D | Keyboard | Regular | On Demand | 10/18/2020 | NA | 0 | 60 | 50 |
| Type E | Mouse | Regular | Periodic based collection | 10/25/2020 | NA | 0 | 30 | 27.3 |

FIG. 12

```
[
  {
    "environment":"xyzLab",
    "archiveThreshold":30,
    "highCompressionThreshold":60,
    "mediumCompressionThreshold":90,
    "noCompressionThreshold":100
  },
  {
    "environment":"abcProd",
    "archiveThreshold":10,
    "highCompressionThreshold":30,
    "mediumCompressionThreshold":50,
    "noCompressionThreshold":100
  }
]
```

FIG. 14

PREDICTING USAGE OF SYSTEM STATE INFORMATION TO DETERMINE COMPRESSION LEVELS

COPYRIGHT NOTICE

A portion of the disclosure of this patent document contains material which is subject to copyright protection. The copyright owner has no objection to the facsimile reproduction by anyone of the patent document or the patent disclosure, as it appears in the Patent and Trademark Office patent file or records, but otherwise reserves all copyright rights whatsoever.

FIELD

The field relates generally to information processing systems, and more particularly to techniques for managing storage in information processing systems.

BACKGROUND

Enterprises or other organizations may utilize large numbers of portable devices, such as laptop or notebook computers, that may be centrally managed and monitored. Various applications and tools may be used by information technology (IT) administrators to effectively deploy, monitor and manage the devices. In some cases, management and monitoring of the devices may include using networks to transfer or upload files including device operational information and to push files to the devices to deploy drivers, firmware and other updates.

SUMMARY

Illustrative embodiments provide techniques for determining compression levels to apply to collected system state information.

In one embodiment, an apparatus comprises at least one processing device comprising a processor coupled to a memory. The at least one processing device is configured to receive system state information corresponding to one or more devices, to predict a usage frequency of the system state information using one or more machine learning models, and to determine, based at least in part on the usage frequency, a compression level for storage of the system state information. The compression level is applied to the system state information to generate at least one compressed file for transmission to a database.

These and other illustrative embodiments include, without limitation, methods, apparatus, networks, systems and processor-readable storage media.

BRIEF DESCRIPTION OF THE DRAWINGS

FIG. 3 depicts a table of a dataset of system state data used for training and testing a machine learning model to be used in connection with determining compression levels in an illustrative embodiment.

FIG. 5 depicts additional columns added to the table in FIG. 3 to illustrate computation of pseudo residual values based on a difference between observed and initial predicted usage frequency of data in an illustrative embodiment.

FIGS. 6A, 6B, 6C and 6D depict tables of different system state data factors and their corresponding pseudo residual values to be used in connection with root node determination in an illustrative embodiment.

FIG. 7 depicts a table where the same component type factors and their corresponding pseudo residual values are grouped together in an illustrative embodiment.

FIG. 8 depicts a table where the same number of times a case was reopened and corresponding pseudo residual values are grouped together in an illustrative embodiment.

FIG. 12 depicts an updated version of part of the table from FIG. 5 to illustrate updated predicted data usage frequency based on the initial predicted data usage frequency and learning rate of a trained machine learning model in an illustrative embodiment.

FIG. 14 depicts example pseudocode to illustrate application of determined compression levels in an illustrative embodiment.

DETAILED DESCRIPTION

Illustrative embodiments will be described herein with reference to exemplary information processing systems and associated computers, servers, storage devices and other processing devices. It is to be appreciated, however, that embodiments are not restricted to use with the particular illustrative system and device configurations shown. Accordingly, the term "information processing system" as used herein is intended to be broadly construed, so as to encompass, for example, processing systems comprising cloud computing and storage systems, as well as other types of processing systems comprising various combinations of physical and virtual processing resources. An information processing system may therefore comprise, for example, at least one data center or other type of cloud-based system that includes one or more clouds hosting tenants that access cloud resources.

Figure 1:
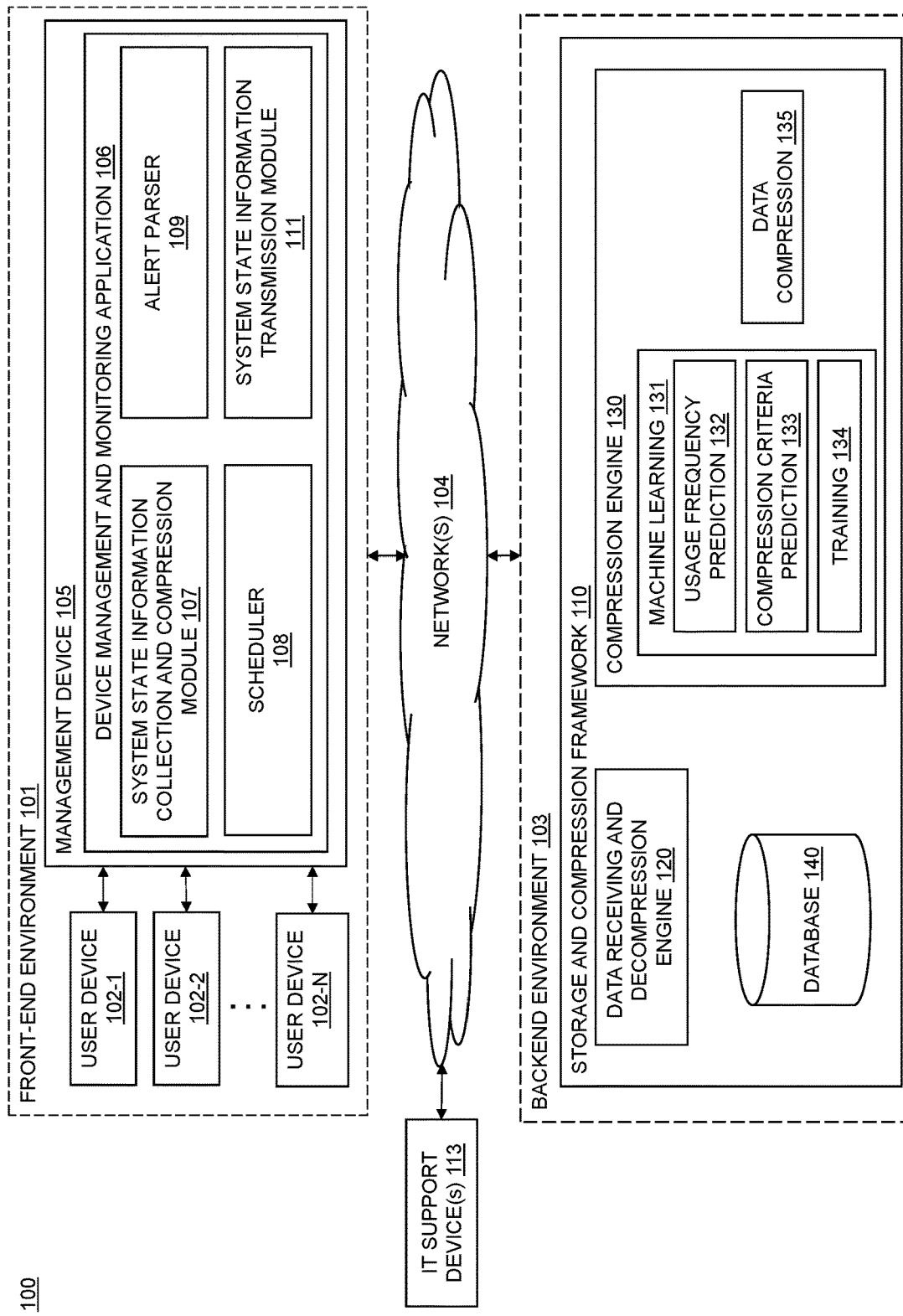
FIG. 1 is a block diagram of an information processing system configured for determining compression levels to apply to collected system state information in an illustrative embodiment.

FIG. 1 shows an information processing system 100 configured in accordance with an illustrative embodiment. The information processing system 100 is assumed to be built on at least one processing platform and provides functionality for determining compression levels to apply to collected system state information. The information processing system 100 comprises a front-end environment 101, a backend environment 103 and IT support devices 113 coupled to a network 104.

The network 104 is assumed to comprise a global computer network such as the Internet, although other types of networks can be part of the network 104, including a wide area network (WAN), a local area network (LAN), a satellite network, a telephone or cable network, a cellular network, a wireless network such as a WiFi or WiMAX network, or various portions or combinations of these and other types of networks.

The front-end environment 101 comprises a set of user devices 102-1, 102-2, ... 102-N (collectively, user devices 102) and a management device 105. The management device 105 is coupled to the user devices 102 via the network 104. The management device 105 includes a device management and monitoring application 106 configured to collect system state information from the user devices 102 and upload the collected system state information to the backend environment 103. In some embodiments, separate instances of the device management and monitoring application 106 run on respective ones of the user devices 102 and the management device 105 can be omitted (e.g., each of the user devices 102 may collect, compress and transmit its system state information to the backend environment 103 on its own rather than using the management device 105).

The user devices 102, management device 105 and IT support devices 113 may comprise respective compute resources, which may include physical and virtual computing resources. Physical computing resources may include physical hardware such as servers, storage systems, networking equipment, Internet of Things (IoT) devices, other types of processing and computing devices, etc. Virtual computing resources may include virtual machines (VMs), software containers, etc.

In some embodiments, the user devices 102, management device 105 and IT support devices 113 are assumed to comprise physical computing devices such as IoT devices, mobile telephones, laptop computers, tablet computers, desktop computers or other types of devices utilized by customers and/or members of an enterprise, in any combination. Such devices are examples of what are more generally referred to herein as "processing devices." Some of these processing devices are also generally referred to herein as "computers." The user devices 102, management device 105 and IT support devices 113 may also or alternately comprise virtualized computing resources, such as VMs, software containers, etc.

The user devices 102, management device 105 and IT support devices 113 in some embodiments comprise respective computers associated with a particular company, organization or other enterprise. In addition, at least portions of the system 100 may also be referred to herein as collectively comprising an "enterprise." Numerous other operating scenarios involving a wide variety of different types and arrangements of processing nodes are possible, as will be appreciated by those skilled in the art.

The front-end and backend environments 101 and 103 are part of an IT infrastructure including customer devices (e.g., user devices 102) in the front-end environment 101, which are managed and monitored by an IT service provider utilizing a backend environment 103 comprising a storage and compression framework 110, where system state information from the user devices 102 is stored and accessed by IT support personnel via IT support devices 113.

The IT service provider provides management, monitoring or other services for the IT infrastructure comprising the front-end and backend environments 101 and 103. In more detail, an IT service provider in accordance with the FIG. 1 embodiment implements the device management and monitoring application 106, which is configured to perform various management, monitoring or other tasks for the user devices 102. The device management and monitoring application 106 comprises support and management software that enables IT administrators to effectively deploy, monitor and manage the user devices 102. For example, the device management and monitoring application 106 comprises a system state information collection and compression module 107, a scheduler 108, an alert parser 109 and a system state information transmission module 111. The system state information collection and compression module 107 collects system state information from the user devices 102 based on one or more triggering events. For example, the scheduler 108 may implement periodic data collections based on, for example, a predetermined schedule. In another scenario, the alert parser 109 may implement the collections of the system state information from the user devices 102 based on some event (e.g., failure, malfunction or reaching a capacity threshold) that results in an alert (e.g., warning alert, critical alert). The alert is parsed by the alert parser 109 which implements a data collection from a user device 102 in response to the event. After the collection of the system state data from the user devices 102, the system state information collection and compression module 107 compresses the collected data into a compressed file and the system state information transmission module 111 uploads the compressed file to the backend environment 103 via the network 104. When uploaded to the backend environment 103, the system state data is available to be consumed by IT support and technical agents via the IT support devices 113.

The system state information collected by the device management and monitoring application 106 comprises, for example, attributes of processors, memories, fans, storage devices, operating systems and other software and hardware components of the user devices 102. Attributes collected from a user device 102 in response to a critical event (e.g., alert-based event) may be of more importance to IT support personnel than attributes collected in periodic (e.g., routine) collections.

Figure 2:
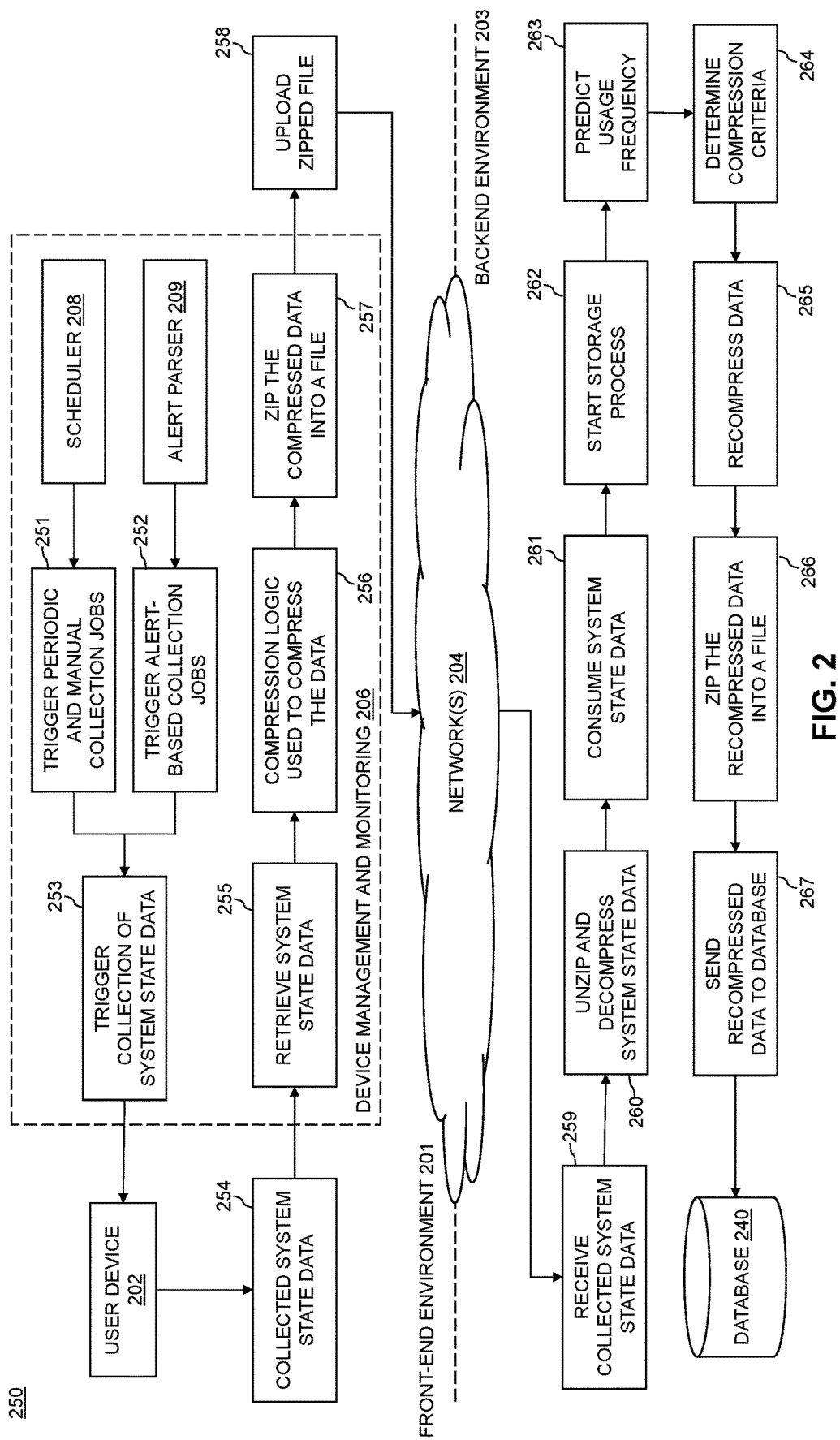
FIG. 2 depicts a system flow for collecting and uploading system state information from a front-end environment to a backend environment and for determining compression levels for the system state information to be applied in the backend environment in an illustrative embodiment.

Referring to the system flow 200 in FIG. 2 front-end and backend environments 201 and 203, which are the same as or similar to the front-end and backend environments 101 and 103 are shown. Similar to the front-end environment 101 and device management and monitoring application 106, the front-end environment 201 comprises a device management and monitoring application 206. As shown in FIG. 2, a scheduler 208, which is the same as or similar to the scheduler 108, triggers periodic and manual collection jobs (block 251), and an alert parser 209, which is the same as or similar to the alert parser 109, triggers alert-based collection jobs (block 252). The periodic and manual collection jobs and the alert-based collection jobs trigger collection of system state data (block 253) (e.g., by the system state information collection and compression module 107) from the user device 202 (which is the same as or similar to one of the user devices 102). "System state information" is also referred to herein as "system state data." Referring to blocks 254 and 255, the collected system state data is retrieved. Referring to blocks 256, 257 and 258, compression logic is used to compress the collected system state data, which is zipped into a compressed file and uploaded via network 204 to the backend environment 203. As can be understood the system state information collection and compression module 107 may perform the tasks in blocks 255, 256 and 257 and the system state information transmission module 111 may perform the task in block 258.

In an illustrative embodiment, the device management and monitoring application 106/206 compresses collected attribute files and uploads the files as a single compressed file over a network 104/204 to the backend environment. Compression of the collected attribute files reduces the overall file size and enables faster transfer or uploading of the files compared to when compression is not used. The size of the compressed file may vary depending on the type or configuration of the user device 102/202 and what triggered the system state information collection.

As shown in FIG. 1, the storage and compression framework 110 includes a data receiving and decompression engine 120, a compression engine 130 and a database 140. The compression engine 130 includes a data compression module 135 and a machine learning module 131 including a usage frequency prediction layer 132, a compression criteria prediction layer 133 and a training layer 134. The file uploaded by the device management and monitoring application 106/206 to the backend environment 103/203 is received, decompressed and unzipped by the data receiving and decompression engine 120 so that the system state data can be consumed and used for various tasks by IT support personnel. As noted hereinabove, the IT support personnel can access the data via one or more IT support devices 113. In more detail, referring to blocks 259 and 260 in FIG. 2, the collected system state data is received in the backend environment, unzipped and decompressed. Referring to block 261, IT support personnel can consume the system state data in connection with various tasks such as, but not necessarily limited to, addressing issues or problems with user devices 102/202, analyzing different IT support cases and updating software and hardware for user devices 102/202.

Referring to block 262 in FIG. 2, once particular system state information is no longer needed or being used, a storage process for the system state information in the backend environment 203 is commenced. As will be explained in more detail herein, instead of using the same level of compression for all types of system state information, the embodiments advantageously use one or machine learning models to predict usage frequency of different system state information. The embodiments avoid unnecessary expansion and improper utilization of storage by taking into account that future demand for different types of collected system state information may vary. For example, absent the techniques of the embodiments, system state data that will not be required for many years may be compressed at the same level as the system state data that will be accessed frequently. This causes expansion in storage requirements at databases and increases in overhead for backend services. The embodiments provide techniques to rebuild data stored being stored in a backend environment by predicting the upcoming frequency of usage of the uploaded system state data, and based on the predicted frequency of usage, optimal levels of compression can be applied to the system state data.

Referring to block 263 in FIG. 2, the usage frequency of the system state information is predicted. In more detail, as shown in FIG. 1, the usage frequency prediction layer 132 of the machine learning module 131 predicts a usage frequency of the system state information using one or more machine learning models. In addition to the characteristics of the system state information noted herein above, the system state information comprises data identifying a plurality of factors associated with the collected system state information. The factors include, for example, device type, component type, alert type corresponding to collection of the system state information, collection type of the system state information and technical support case data. The factors are depicted in the table 300 of FIG. 3, which as described further herein, depicts a dataset of system state data used for training and testing a machine learning model to be used in connection with determining compression levels. Device type may specify, for example, model number, device name or other identifying information of the user device 102/202 from which the system state data collection occurred. Component type may specify, for example, model number, component name (e.g., CPU, hard-disk drive (HDD), memory, keyboard, mouse, etc.) or other identifying information of the component on which the system state data collection was based. Alert type may specify the severity of the alert which triggered the collection such as, for example, critical (high level alert), warning (moderate level alert) and regular (e.g., low level alert). Collection type may specify whether the collection was, for example, alert-based (e.g., as a result of an event such as a failure or malfunction), a manual (on-demand) collection or a periodic (routine or scheduled) collection. The technical support case data includes information such as, but not necessarily limited to, data identifying when a technical support case was opened (e.g., case creation date and when data was uploaded to the backend environment), when the technical support case was reopened (e.g., latest date when the case was reopened) and a number of times the technical support case was reopened.

The usage frequency prediction layer 132 uses a supervised machine learning model to predict usage frequency. The training layer 134 trains the supervised machine learning model using a gradient boost for regression algorithm because the target variable (i.e., usage frequency) is a continuous variable. The gradient boost for regression algorithm uses decision trees and regression to determine the continuous value of the usage frequency. Once the model is trained using a training dataset, usage frequency prediction layer 132 uses the model to predict the frequency of usage of system state data.

Figure 4:
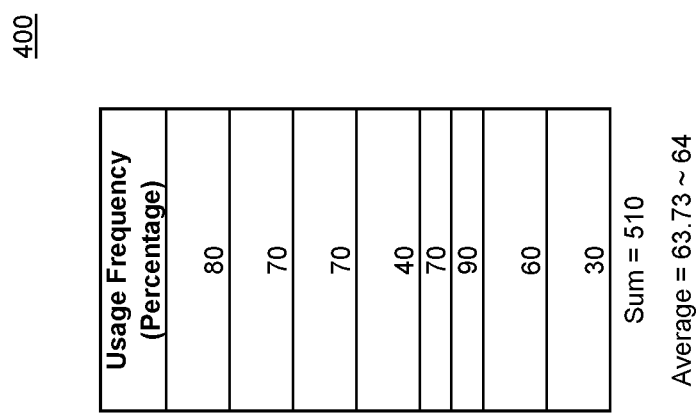
FIG. 4 depicts a portion of the table in FIG. 3 to illustrate computation of an average frequency of usage of the data in an illustrative embodiment.

Referring back to FIG. 3, in addition to the plurality of factors associated with the collected system state information, the dataset also specifies an observed frequency of usage (specified as a percentage) for each row. As can be seen in the table 300, the different rows include at least one column entry that is different from another row. According to an embodiment, in connection with training the machine learning model, referring to the table 400 in FIG. 4, the training layer 134 computes an approximate average of the usage frequency values in the training dataset by adding the usage frequency values, dividing the sum by the total number of frequency values in the training dataset and rounding off the result. The approximate average of the usage frequency values becomes the initial predicted usage frequency value. Referring to FIG. 5, the table 500 depicts two additional columns added to the end of table 300 to illustrate the computation of pseudo residual usage frequency values by finding a difference between the initial predicted usage frequency value and the observed usage frequency values for respective ones of the plurality of rows in the dataset.

Referring to FIGS. 6A, 6B, 6C and 6D, the tables 601, 602, 603 and 604 depict different system state data factors (i.e., component type, alert type, collection type and case reopen times) and their corresponding pseudo residual usage frequency values to be used in connection with root node determination. In each set of columns, different system state data factors and corresponding pseudo residual usage frequency values are input to a node calculator of the training layer 134, which determines root nodes for different decision trees based on different ones of the system state factors. In more detail, the gradient boost for regression algorithm uses multiple regression trees, with each tree being a refined version of a previous tree, with predictions being closer to the actual values. The training layer 134 determines the root node for each set of regression trees corresponding to a given one of the system state factors using the sum of squared residuals (SSR). Specifically, the SSRs for respective ones of the plurality of factors (columns) in each row of a dataset is calculated, and a minimum one of the SSRs for the respective ones of the plurality of factors is identified. The specific factor corresponding to the minimum SSR for a given one of the system state factors is the basis for assignment as the root node for each set of regression trees corresponding to the given one of the system state factors.

For example, referring to the table 700 in FIG. 7, taking component type as a factor to be analyzed, the same component type factors (e.g., CPU, CPU, HDD, HDD, Memory, Memory) and their corresponding pseudo residual usage frequency values are grouped together. For each component, the training layer 134 calculates the average pseudo residual usage frequency value, and then based on the average, computes the residual values to be squared (i.e., pseudo residual value-average value). The residual values are then squared and added for each component. The component having the least SSR is assigned as or is used a basis for assignment of a root node of the regression trees corresponding to component type. For illustrative purposes, some of the calculations are set forth below:

For Component Type=CPU: Average: (6+26)/2=16
For CPU point 1: Residual=Pseudo Residual Value−Average=6−16=−10
For CPU point 2: Residual=Pseudo Residual Value−Average=26−16=10
Square the points and add them:
Square: $(-10)^2$=100 and $(10)^2$=100
100+100=200

$SSR_{CPU}$=200 (i)

For Component Type=HDD: Average: (6+16)/2=11
For HDD point 1: Residual=Pseudo Residual Value−Average=6−11=−5
For HDD point 2: Residual=Pseudo Residual Value−Average=16−11=5
Square the points and add them:
Square: $(-5)^2$=25 and $(5)^2$=25
25+25=50

$SSR_{HDD}$=50 (ii)

Similarly:

For Component Type=Keyboard: $SSR_{KB}$=16 (iii)

For Component Type=Memory: $SSR_{MEM}$=452 (iv)

For Component Type=Mouse: $SSR_{MOUSE}$=1156 (v)

Based on (i), (ii), (iii), (iv), (v), the component type having the lowest SSR is "keyboard" and is assigned as or is used as a basis for assignment of the root node for the regression trees corresponding to component type. Similarly, the minimum SSRs are computed for the other factors (columns) designated in FIGS. 6B, 6C and 6D (i.e., alert type, collection type, case reopen times).

Figure 9:
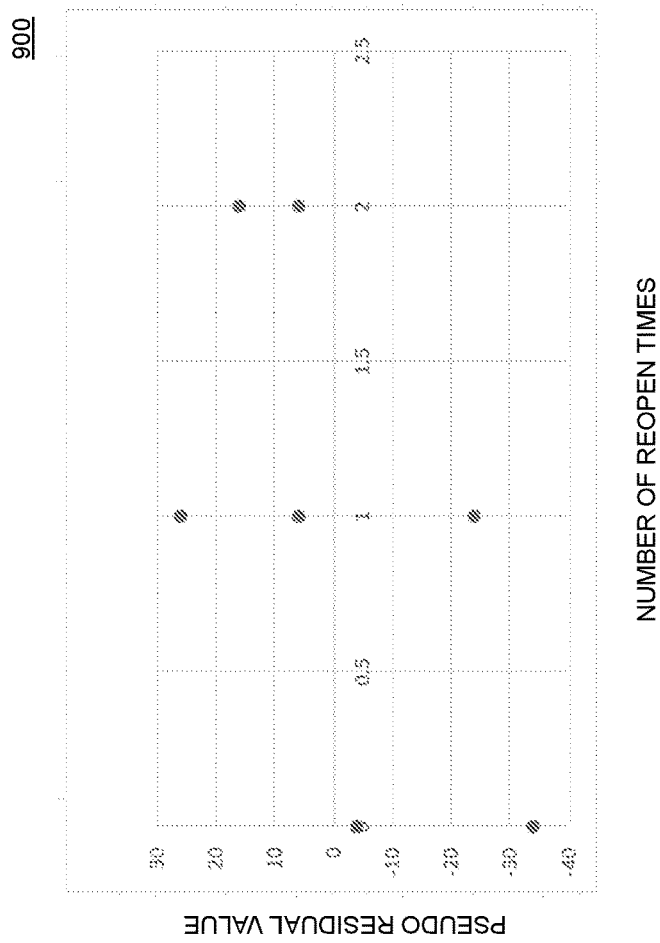
FIG. 9 depicts a plot of pseudo residual values versus the number of times a case was reopened in an illustrative embodiment.

Similar to the table 700 in FIG. 7, taking case reopen times as a factor to be analyzed, the table 800 in FIG. 8 includes the same case reopen times (e.g., 0, 0, 1, 1, 1, 1, 2, 2) and their corresponding pseudo residual usage frequency values grouped together. For each number of case reopen times, the training layer 134 calculates the average pseudo residual usage frequency value, and then based on the average, computes the residual values to be squared (i.e., pseudo residual value-average value). The residual values are then squared and added for each number of case reopen times. The number of case reopen times having the least SSR is assigned as or is used a basis for assignment of a root node for the regression trees corresponding to the number of case reopen times. FIG. 9 depicts a plot 900 of the pseudo residual values versus the number of times a case was reopened, which corresponds to the table 800.

Figure 10:
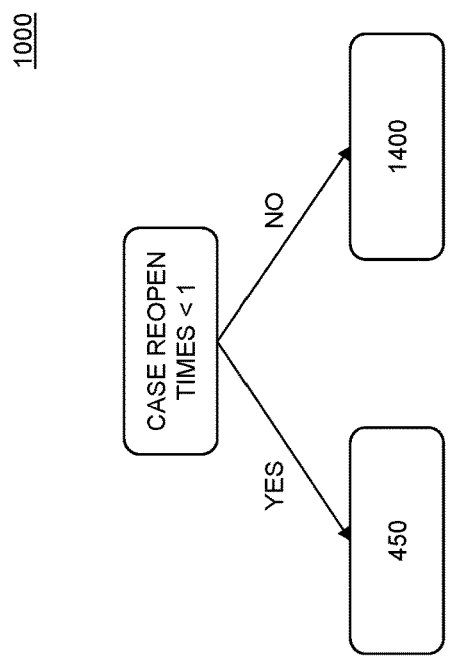
FIG. 10 depicts a decision tree including a root node specifying the number of times a case was reopened as being less than 1 in an illustrative embodiment.

FIG. 10 depicts a decision tree 1000 including a root node specifying the number of times a case was reopened as being less than 1. Based on the data in the table 800 and the plot 900, for the left leaf, where case reopen times<1 is true:
Average=(−34+(−4))/2=−38/2=−19
Therefore, SSR=$(-34-(-19))^2+(-4-(-19))^2$=450
Similarly, the SSR for the right leaf, where case reopen times<1 is false:
Average=(−24+6+6+26+6+16)/6=6
Therefore, SSR=$(-24-6)^2+(6-6)^2+(6-6)^2+(26-6)^2+(6-6)^2+(16-6)^2$=1400

In this case, the residual for the decision tree 1000 is computed as follows: Left Leaf SSR (450)+Right Leaf SSR (1400), which is equal to 1850. The training layer 134 further computes the SSRs for the remaining case reopen times in the data (i.e., for case reopen times<2 and case reopen times=2). Assuming that the minimum SSR corresponds to case reopen times<1, a decision tree is built taking case reopen times<1 as the root node. According to an embodiment, the specific factor corresponding to the minimum SSR for a given one of the system state factors becomes the root node for one or more regression trees corresponding to the given one of the system state factors.

Figure 11:
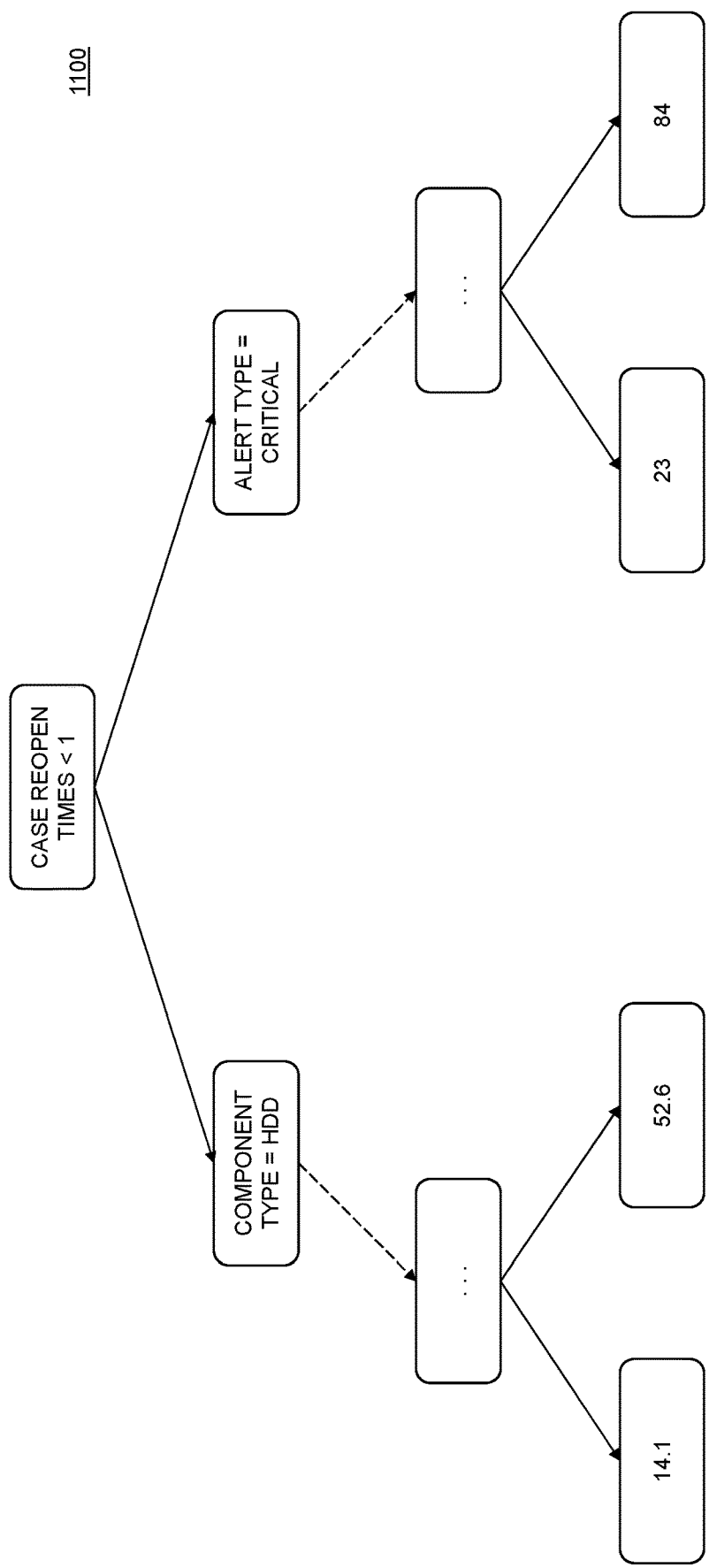
FIG. 11 depicts a decision tree including a root node specifying the number of times a case was reopened as being less than 1 and further specifying a hard-disk drive component type and a critical alert type in an illustrative embodiment.

FIG. 11 depicts a decision tree 1100 including a root node specifying the number of times a case was reopened as being less than 1 and further specifying a hard-disk drive component type and a critical alert type. According to an embodiment, the usage frequency prediction layer 132 of the machine learning module 131 uses the decision tree 1100 to predict usage frequency for a test dataset based on the data in table 300. According to an embodiment, the usage frequency prediction layer 132 predicts the usage frequency of the system state information in the test dataset by applying a learning rate to respective residual usage frequency values determined by a plurality of gradient boost decision trees, starting with decision tree 1100. Since new decision trees correct residual errors in predictions from existing decision trees, and the machine learning model may quickly fit and then overfit a training dataset, learning rate is used as a weight factor to slow down learning in a gradient boosting model. The learning rate may vary. According to some embodiments the learning rate is in the range of 0.1 to 0.8. According to an embodiment, predicted usage frequency is determined according to the following equation (1):

Predicted Usage Frequency=Initial Prediction+(Learning Rate*Residual) (1)

For purposes of explanation, based on the decision tree 1100, for row 1 of the dataset in table 300, the determined residual from the decision tree 1100 is 23. Then, using formula (1), with a learning rate of 0.5, and the initial prediction of 64 from the calculated average from the table 400, the predicted usage frequency is equal to 64+0.5*23=75.5

Similarly, the usage frequency prediction layer 132 uses the trained machine learning model to find the updated predicted usage frequency values for the remaining rows in the dataset by determining the residuals from the decision tree 1100, where the initial prediction is 64 and the learning rate is 0.5. Table 1200 in FIG. 12 depicts an updated version of part of the table 500 to illustrate the updated predicted data usage frequency values based on the initial predicted data usage frequency and the learning rate of the trained machine learning model. The updated predicted data usage frequency values are shown in the last column of the table 1200.

Figure 13:
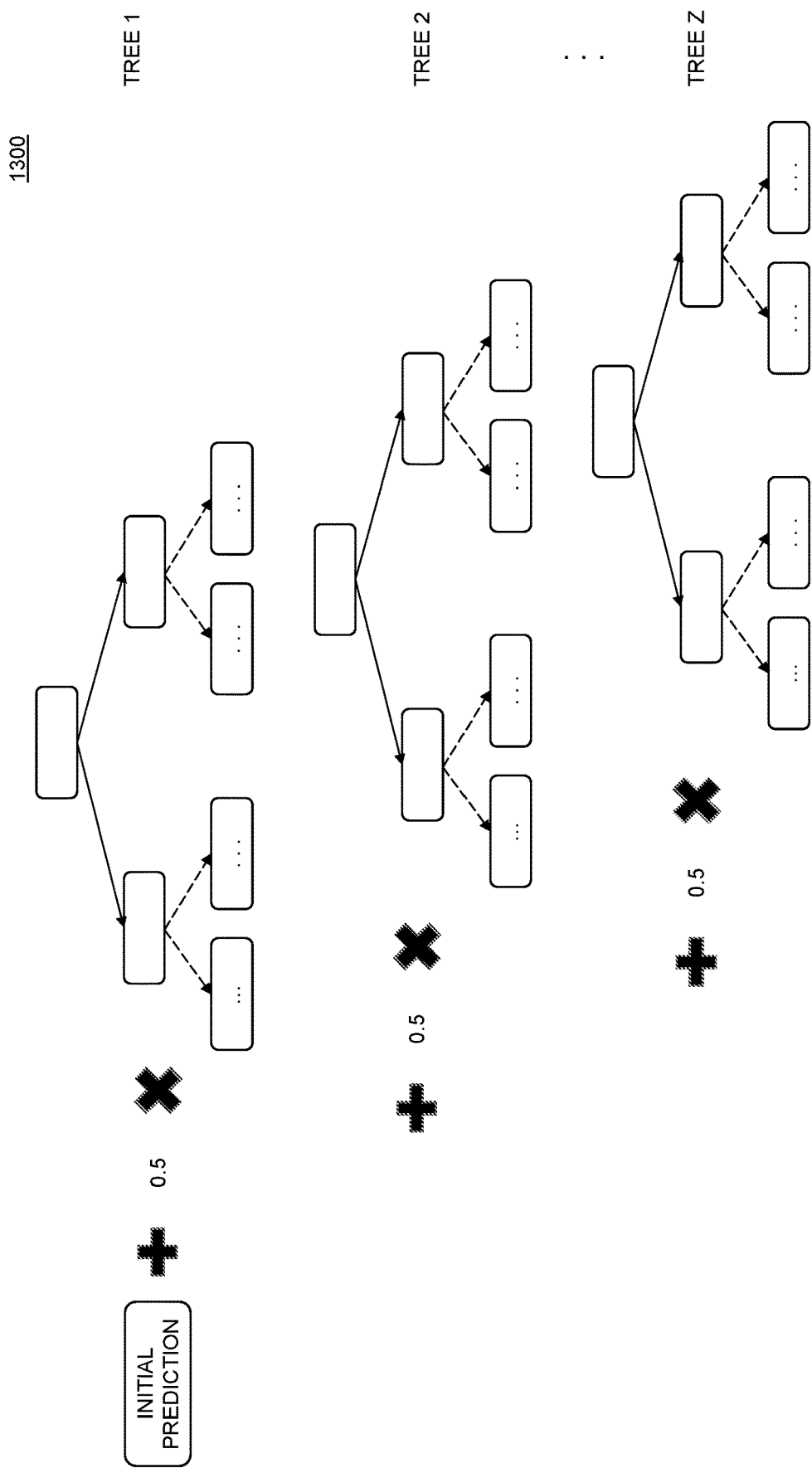
FIG. 13 depicts a plurality of decision trees used by a machine learning model in connection with predicted data usage frequency in an illustrative embodiment.

According to an embodiment, once we find the predicted usage frequency for all entries in the dataset are computed, the usage frequency prediction layer 132 repeats the steps described in connection with FIGS. 4-11, where the predicted frequency from tree 1 (e.g., decision tree 1100) is used to determine the pseudo residual usage frequency values for subsequent trees (tree 2, . . . , tree Z) as shown in tree diagram 1300 in FIG. 13. Decision trees are generated until a specified maximum number of trees has been generated or adding additional trees does not significantly reduce the size of the residual values.

With reference to the trees in the tree diagram 1300 (tree 1, tree 2, . . . , tree Z), the formula used by the usage frequency prediction layer 132 to make predictions at every tree level is given by the following equation (2):

$$\text{Predicted Usage Frequency} = \text{Initial Prediction} + \\ (\text{Learning Rate} * \text{Scaled Residual of Tree 1}) + \\ (\text{Learning Rate} * \text{Scaled Residual of Tree 2}) + \ldots \\ + (\text{Learning Rate} * \text{Scaled Residual of Tree Z}) \quad (2)$$

This trained model is used to predict the usage frequency for upcoming collected system data that is uploaded to the backend environment 103/203. Referring back to FIG. 2, once usage frequency is predicted (block 263), the compression criteria prediction layer 133 determines the compression criteria on which the compression level for compressing the system state data is based (block 264). For example, the predicted usage frequencies for the system state factors are combined using multiple linear regression, and the compression level for storage of the system state information is determined based at least in part on the combined predicted usage frequencies.

According to an embodiment, once the predicted usage frequency is determined in accordance with the formula (2), multiple linear regression is performed to determine an "alpha factor" according to the following equation (3):

$$Y = b_0 + b_1 X_1 + b_2 X_2 + \ldots + b_p X_p \quad (3)$$

where b1 is the change in Y relative to one unit change in $X_1$, while holding all the other independent variables constant, and so on for $b_2, \ldots, b_p$. According to an embodiment, the variables X represent the different factors (e.g., device type, component type, alert type corresponding to collection of the system state information, collection type of the system state information, case open date, case reopen date and case reopen times), and the variables b correspond to usage frequencies associated with the different factors. Based on the alpha factor, compression level for storage of the system state data is determined.

Referring to FIGS. 1 and 2, the data compression module 135 recompresses the system state data at the determined compression level (block 265), zips the compressed data into a file (block 266) and sends the compressed file to a database 140/240 (block 267) for storage in the backend environment 103/203. According to an embodiment, the data may be stored in the database for a given time period (e.g., n number of years) as determined by a service level agreement (SLA) with the customer. The example pseudocode 1400 in FIG. 14 demonstrates how after classifying the level of compression, the information is passed to the data compression module 135 using a JavaScript Object Notation (JSON) data structure.

Referring to the example pseudocode 1400, environment represents a source from where the collected system state data is uploaded to the backend environment 103/203, and "archiveThreshold," "highCompressionThreshold," "mediumCompressionThreshold," and "noCompression Threshold" indicate the compression levels for the data.

According to an embodiment, the storage and compression framework compresses the system state data based on the compression threshold identified in the JSON data structure. Once the system state data is compressed, it can be stored in the database 140/240 for further use by customers and/or technical support personnel for a given time period or a subsequent trigger of storage and compression framework 110 to re-evaluate whether the compression level of stored system state data should be changed based on a different predicted usage frequency, whichever occurs first.

For example, the usage frequency and compression criteria prediction is re-executed by the storage and compression framework 110 at certain intervals until the data no longer needs to be stored in the database 140/240. The algorithms described herein will run periodically as the rebuilding of storage is a continuous process. For example, the collected system state data files present the database 140/240 will be periodically analyzed by the storage and compression framework 110. The need to run the algorithms may depend on various factors such as, for example, a frequency of alerts for a particular type of data collection, a number of alerts received for the particular type of data collection and/or a number of times system state data is accessed in response to particular alerts.

In an operational example, there may be a device "X" that is newly released in the market (e.g., one of the user devices 102). After usage by a customer, an issue occurs in one of its components, which results in the generation of an alert on the device management and monitoring application 106/206. The device management and monitoring application 106/206, upon receiving the alert, commences a collection of system state data from the given device. The collected system state data is uploaded to the backend environment 103/203. Following consumption by IT support personnel (e.g., via one or more IT support devices 113), the system state data is input to the machine learning module 131 to determine its level of compression. The machine learning module 131 may predict high usage and determine a low level of compression since the device 'X' is a new release and the machine learning model may have learned that newly released devices are expected to receive similar types of alerts more frequently than earlier released devices. After some passage of time, assuming there have been updates created and released for device "X," the similar types of alerts may decrease or no longer be received for device "X." In this scenario, re-executing the analysis results in predicting less frequency of usage, so that determined levels of compression will be higher. Accordingly, by periodically predicting the usage frequency, the embodiments account for varying levels of use of the data. Advantageously, by running this framework periodically, the embodiments ensure optimal health of a storage environment by evaluating and modifying storage constraints at regular intervals for available system state information files in a backend environment. The embodiments, therefore, allow for iteratively predicting usage frequency of the system state information using the one or more machine learning models, determining, based on at least one iteratively predicted usage frequency, that a compression level be changed to a different compression level for storage of the system state information, and applying the different compression level to the system state information to generate at least one new compressed file to replace a file stored at the previously determined compression level.

The database 140/240 may be implemented using one or more storage systems or devices. In some embodiments, one or more of such storage systems may comprise a scale-out all-flash content addressable storage array or other type of storage array. The term "storage system" as used herein is therefore intended to be broadly construed, and should not be viewed as being limited to content addressable storage systems or flash-based storage systems. A given storage system as the term is broadly used herein can comprise, for example, network-attached storage (NAS), storage area networks (SANs), direct-attached storage (DAS) and distributed DAS, as well as combinations of these and other storage types, including software-defined storage.

Other particular types of storage products that can be used in implementing storage systems in illustrative embodiments include all-flash and hybrid flash storage arrays, software-defined storage products, cloud storage products, object-based storage products, and scale-out NAS clusters. Combinations of multiple ones of these and other storage products can also be used in implementing a given storage system in an illustrative embodiment.

Although not explicitly shown in FIG. 1, one or more input-output devices such as keyboards, displays or other types of input-output devices may be used to support one or more user interfaces to the user devices 102, the management device 105, IT support devices 113, the storage and compression framework 110, or components thereof, as well as to support communication between the user devices 102, the management device 105, IT support devices 113, the storage and compression framework 110 and other related systems and devices not explicitly shown.

The user devices 102 are assumed to be utilized by various different users. The term "user" herein is intended to be broadly construed so as to encompass numerous arrangements of human, hardware, software or firmware entities, as well as combinations of such entities.

The user devices 102, the management device 105, IT support devices 113 and the storage and compression framework 110 in the FIG. 1 embodiment are assumed to be implemented using at least one processing device. Each such processing device generally comprises at least one processor and an associated memory, and implements one or more functional modules for controlling certain features of the user devices 102, the management device 105, IT support devices 113 and the storage and compression framework 110.

At least portions of the device management and monitoring application 106 including the system state information collection and compression module 107, the scheduler 108, the alert parser 109, and the system state information transmission module 118, and at least portions of the storage and compression framework 110 including the data receiving and decompression engine 120 and the compression engine 130, and other components of the information processing system 100 may be implemented at least in part in the form of software that is stored in memory and executed by processors of such processing devices.

It is to be appreciated that the particular arrangement of the user devices 102, the management device 105, the IT support devices 113 and the storage and compression framework 110 illustrated in the FIG. 1 embodiment is presented by way of example only, and alternative arrangements can be used in other embodiments. It is to be understood that the particular set of elements shown in FIG. 1 for determining compression levels to apply to collected system state information is presented by way of illustrative example only, and in other embodiments additional or alternative elements may be used. Thus, another embodiment may include additional or alternative systems, devices and other network entities, as well as different arrangements of modules and other components.

One or more of the user devices 102, the management device 105, IT support devices 113 and the storage and compression framework 110, in some embodiments, may be part of cloud infrastructure as will be described in further detail below.

The user devices 102, the management device 105, IT support devices 113, the storage and compression framework 110 and other components of the information processing system 100 in the FIG. 1 embodiment, are assumed to be implemented using at least one processing platform comprising one or more processing devices each having a processor coupled to a memory. Such processing devices can illustratively include particular arrangements of compute, storage and network resources.

The user devices 102, the management device 105, IT support devices 113 and the storage and compression framework 110, or components thereof, may be implemented on respective distinct processing platforms, although numerous other arrangements are possible. For example, in some embodiments at least portions of the user devices 102 and the management device 105 or at least portions of the IT support devices 113 and the storage and compression framework are implemented on the same processing platform.

The term "processing platform" as used herein is intended to be broadly construed so as to encompass, by way of illustration and without limitation, multiple sets of processing devices and associated storage systems that are configured to communicate over one or more networks. For example, distributed implementations of the system 100 are possible, in which certain components of the system reside in one data center in a first geographic location while other components of the system reside in one or more other data centers in one or more other geographic locations that are potentially remote from the first geographic location. Thus, it is possible in some implementations of the system 100 for user devices 102, the management device 105, IT support devices 113 and the storage and compression framework 110, or portions or components thereof, to reside in different data centers. Numerous other distributed implementations are possible. The user devices 102, the management device 105, IT support devices 113 and the storage and compression framework 110 can also be implemented in a distributed manner across multiple data centers.

Additional examples of processing platforms utilized to implement portions of the information processing system 100 of FIG. 1 in illustrative embodiments will be described in more detail below in conjunction with FIGS. 16 and 17.

It is to be appreciated that these and other features of illustrative embodiments are presented by way of example only, and should not be construed as limiting in any way.

An exemplary process for determining compression levels to apply to collected system state information will now be described in more detail with reference to the flow diagram of FIG. 15. It is to be understood that this particular process is only an example, and that additional or alternative processes for determining compression levels to apply to collected system state information can be carried out in other embodiments.

In this embodiment, the process 1500 includes steps 1502 through 1510. These steps are assumed to be performed at least in part by the storage and compression framework 110. The process begins with step 1502, where system state information corresponding to one or more devices is received by, for example, the data receiving and decompression engine 120. The system state information comprises data identifying a plurality of factors comprising, for example, a device type, a component type, an alert type corresponding to collection of the system state information, a collection type of the system state information and/or technical support case data. The technical support case data comprises data identifying when a technical support case was opened, when the technical support case was reopened and/or a number of times the technical support case was reopened.

In step 1504, a usage frequency of the system state information is predicted using one or more machine learning models. The predicting includes applying the plurality of factors to a plurality of decision trees, wherein one or more of the plurality of factors comprise one or more nodes of the plurality of decision trees. The plurality of decision trees may comprise a plurality of gradient boost decision trees.

In step 1506, based at least in part on the usage frequency, a compression level for storage of the system state information is determined. According to an embodiment, the predicting includes predicting a usage frequency of the system state information for respective ones of the plurality of factors, and combining the usage frequencies of the system state information for the respective ones of the plurality of factors using multiple linear regression. The compression level for storage of the system state information is determined based at least in part on the combined usage frequencies.

In step 1508, the compression level is applied to the system state information to generate at least one compressed file, and in step 1510, the at least one compressed file is transmitted to a database.

An exemplary process further includes training the one or more machine learning models using a training dataset comprising observed usage frequency of system state information for a plurality of devices, wherein the system state information for the plurality of devices comprises data identifying the plurality of factors for respective ones of the plurality of devices. The training is performed using a gradient boost for regression algorithm, and includes computing an initial predicted usage frequency value for the plurality of devices, and computing residual usage frequency values for respective ones of the plurality of devices based, at least in part, on a difference between observed usage frequency values for respective ones of the plurality of devices and the initial predicted usage frequency value.

In one or more embodiments, the training includes computing sums of squares of the residual usage frequency values for respective ones of the plurality of factors for the plurality of devices, and identifying a minimum one of the sums of squares of the residual usage frequency values for the respective ones of the plurality of factors for the plurality of devices. One or more root nodes of one or more decision trees are specified based, at least in part, on one or more of the minimum ones of the sums of squares of the residual usage frequency values. The usage frequency of the system state information corresponding to the one or more devices is predicted by applying a learning rate to respective residual usage frequency values determined by the one or more decision trees.

In an embodiment, the usage frequency of the system state information is iteratively predicted using the one or more machine learning models. Based on at least one iteratively predicted usage frequency, a determination is made that the compression level be changed to a different compression level for storage of the system state information, and the different compression level is applied to the system state information to generate at least one new compressed file. The at least one new compressed file is transmitted to the backend database.

Figure 15:
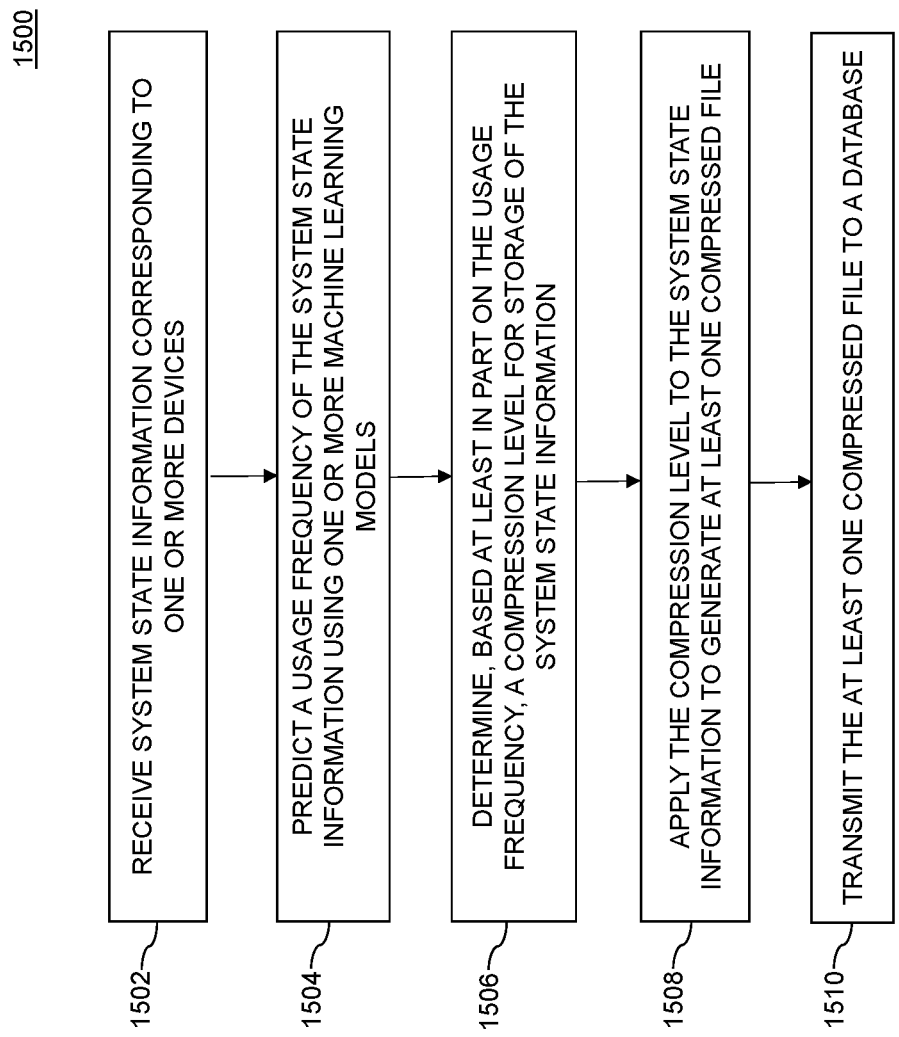
FIG. 15 is a flow diagram of an exemplary process for determining compression levels to apply to collected system state information in an illustrative embodiment.

It is to be appreciated that the FIG. 15 process and other features and functionality described above can be adapted for use with other types of information systems configured to execute compression level determination services in storage and compression framework or other type of platform.

The particular processing operations and other system functionality described in conjunction with the flow diagram of FIG. 15 are therefore presented by way of illustrative example only, and should not be construed as limiting the scope of the disclosure in any way. Alternative embodiments can use other types of processing operations. For example, the ordering of the process steps may be varied in other embodiments, or certain steps may be performed at least in part concurrently with one another rather than serially. Also, one or more of the process steps may be repeated periodically, or multiple instances of the process can be performed in parallel with one another.

Functionality such as that described in conjunction with the flow diagram of FIG. 15 can be implemented at least in part in the form of one or more software programs stored in memory and executed by a processor of a processing device such as a computer or server. As will be described below, a memory or other storage device having executable program code of one or more software programs embodied therein is an example of what is more generally referred to herein as a "processor-readable storage medium."

Illustrative embodiments of systems with a storage and compression framework as disclosed herein can provide a number of significant advantages relative to conventional arrangements. For example, the embodiments advantageously address issues caused by improper usage of vendor storage by varying compression levels of the data based on predicted usage frequency of the collected system state data. The prediction of the usage frequency takes into account a variety of factors including, but not necessarily limited to, the number of times a case corresponding to the system state data was reopened, criticality of alerts triggering the data collection, collection type, component type and device type. As an additional advantage, the embodiments use a trained machine learning model comprising, for example, a gradient boost for regression algorithm and decision trees to predict usage frequency. Using multiple linear regression, the compression level (e.g., low, medium, or high) is determined.

Instead of using the same level of compression for all types of the system state data, regardless of the type of data and its anticipated usage, the embodiments rebuild the data being stored in backend environments for the long term by predicting the upcoming frequency of usage of uploaded system state data, and based on this prediction, the optimal levels of compression can be applied to the system state data. As a result, the embodiments implement dynamic levels of compression, thereby reducing storage requirements and database overhead.

It is to be appreciated that the particular advantages described above and elsewhere herein are associated with particular illustrative embodiments and need not be present in other embodiments. Also, the particular types of information processing system features and functionality as illustrated in the drawings and described above are exemplary only, and numerous other arrangements may be used in other embodiments.

Illustrative embodiments of processing platforms utilized to implement functionality for determining compression levels to apply for different logical chunks of collected system state information will now be described in greater detail with reference to FIGS. 16 and 17. Although described in the context of system 100, these platforms may also be used to implement at least portions of other information processing systems in other embodiments.

Figure 16:
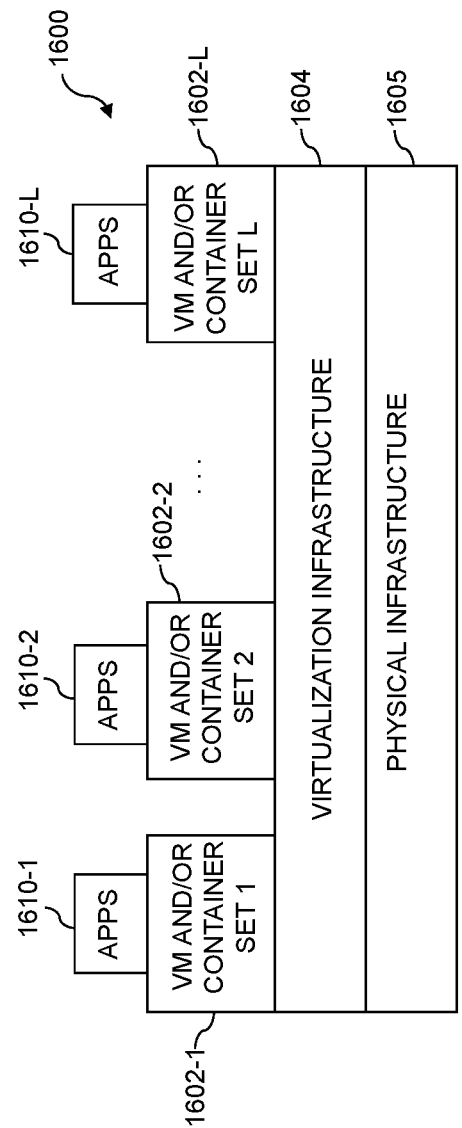
FIGS. 16 and 17 show examples of processing platforms that may be utilized to implement at least a portion of an information processing system in illustrative embodiments.
Figure 17:
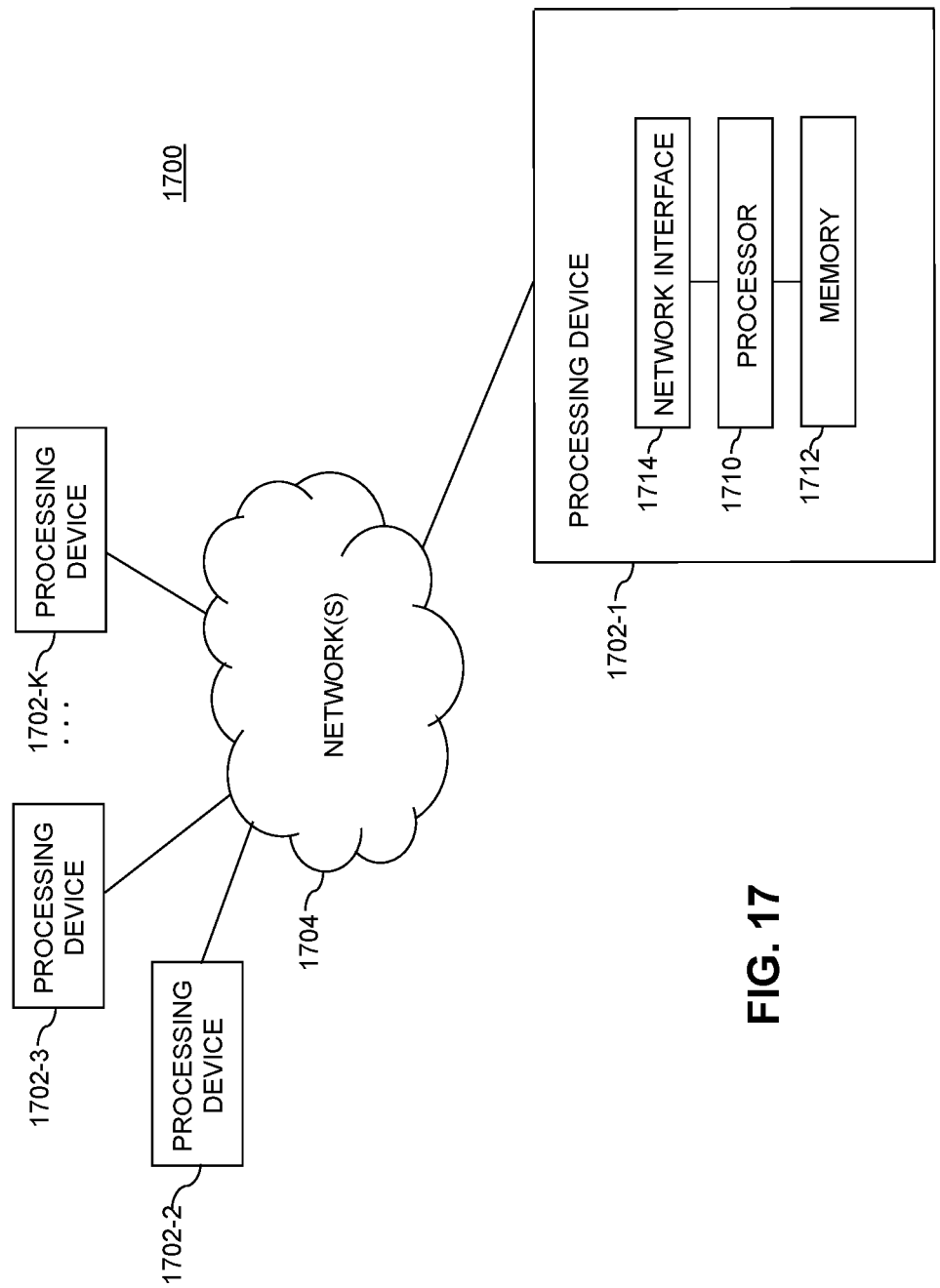

FIG. 16 shows an example processing platform comprising cloud infrastructure 1600. The cloud infrastructure 1600 comprises a combination of physical and virtual processing resources that may be utilized to implement at least a portion of the information processing system 100 in FIG. 1. The cloud infrastructure 1600 comprises multiple virtual machines (VMs) and/or container sets 1602-1, 1602-2, . . . 1602-L implemented using virtualization infrastructure 1604. The virtualization infrastructure 1604 runs on physical infrastructure 1605, and illustratively comprises one or more hypervisors and/or operating system level virtualization infrastructure. The operating system level virtualization infrastructure illustratively comprises kernel control groups of a Linux operating system or other type of operating system.

The cloud infrastructure 1600 further comprises sets of applications 1610-1, 1610-2, . . . 1610-L running on respective ones of the VMs/container sets 1602-1, 1602-2, . . . 1602-L under the control of the virtualization infrastructure 1604. The VMs/container sets 1602 may comprise respective VMs, respective sets of one or more containers, or respective sets of one or more containers running in VMs.

In some implementations of the FIG. 16 embodiment, the VMs/container sets 1602 comprise respective VMs implemented using virtualization infrastructure 1604 that comprises at least one hypervisor. A hypervisor platform may be used to implement a hypervisor within the virtualization infrastructure 1604, where the hypervisor platform has an associated virtual infrastructure management system. The underlying physical machines may comprise one or more distributed processing platforms that include one or more storage systems.

In other implementations of the FIG. 16 embodiment, the VMs/container sets 1602 comprise respective containers implemented using virtualization infrastructure 1604 that provides operating system level virtualization functionality, such as support for Docker containers running on bare metal hosts, or Docker containers running on VMs. The containers are illustratively implemented using respective kernel control groups of the operating system.

As is apparent from the above, one or more of the processing modules or other components of system 100 may each run on a computer, server, storage device or other processing platform element. A given such element may be viewed as an example of what is more generally referred to herein as a "processing device." The cloud infrastructure 1600 shown in FIG. 16 may represent at least a portion of one processing platform. Another example of such a processing platform is processing platform 1700 shown in FIG. 17.

The processing platform 1700 in this embodiment comprises a portion of system 100 and includes a plurality of processing devices, denoted 1702-1, 1702-2, 1702-3, . . . 1702-K, which communicate with one another over a network 1704.

The network 1704 may comprise any type of network, including by way of example a global computer network such as the Internet, a WAN, a LAN, a satellite network, a telephone or cable network, a cellular network, a wireless network such as a WiFi or WiMAX network, or various portions or combinations of these and other types of networks.

The processing device 1702-1 in the processing platform 1700 comprises a processor 1710 coupled to a memory 1712.

The processor 1710 may comprise a microprocessor, a microcontroller, an application-specific integrated circuit (ASIC), a field-programmable gate array (FPGA), a central processing unit (CPU), a graphical processing unit (GPU), a tensor processing unit (TPU), a video processing unit (VPU) or other type of processing circuitry, as well as portions or combinations of such circuitry elements.

The memory 1712 may comprise random access memory (RAM), read-only memory (ROM), flash memory or other types of memory, in any combination. The memory 1712 and other memories disclosed herein should be viewed as illustrative examples of what are more generally referred to as "processor-readable storage media" storing executable program code of one or more software programs.

Articles of manufacture comprising such processor-readable storage media are considered illustrative embodiments. A given such article of manufacture may comprise, for example, a storage array, a storage disk or an integrated circuit containing RAM, ROM, flash memory or other electronic memory, or any of a wide variety of other types of computer program products. The term "article of manufacture" as used herein should be understood to exclude transitory, propagating signals. Numerous other types of computer program products comprising processor-readable storage media can be used.

Also included in the processing device 1702-1 is network interface circuitry 1714, which is used to interface the processing device with the network 1704 and other system components, and may comprise conventional transceivers.

The other processing devices 1702 of the processing platform 1700 are assumed to be configured in a manner similar to that shown for processing device 1702-1 in the figure.

Again, the particular processing platform 1700 shown in the figure is presented by way of example only, and system 100 may include additional or alternative processing platforms, as well as numerous distinct processing platforms in any combination, with each such platform comprising one or more computers, servers, storage devices or other processing devices.

For example, other processing platforms used to implement illustrative embodiments can comprise converged infrastructure.

It should therefore be understood that in other embodiments different arrangements of additional or alternative elements may be used. At least a subset of these elements may be collectively implemented on a common processing platform, or each such element may be implemented on a separate processing platform.

As indicated previously, components of an information processing system as disclosed herein can be implemented at least in part in the form of one or more software programs stored in memory and executed by a processor of a processing device. For example, at least portions of the functionality for determining compression levels to apply for different logical chunks of collected system state information as disclosed herein are illustratively implemented in the form of software running on one or more processing devices.

It should again be emphasized that the above-described embodiments are presented for purposes of illustration only. Many variations and other alternative embodiments may be used. For example, the disclosed techniques are applicable to a wide variety of other types of information processing systems, system state information, compression algorithms, etc. Also, the particular configurations of system and device elements and associated processing operations illustratively shown in the drawings can be varied in other embodiments. Moreover, the various assumptions made above in the course of describing the illustrative embodiments should also be viewed as exemplary rather than as requirements or limitations of the disclosure. Numerous other alternative embodiments within the scope of the appended claims will be readily apparent to those skilled in the art.

What is claimed is:

1. An apparatus comprising:
  at least one processing device comprising a processor coupled to a memory;
  the at least one processing device being configured to:
    receive system state information corresponding to one or more devices, wherein the system state information comprises data identifying a plurality of factors including at least technical support case data, wherein the technical support case data comprises at least data identifying a number of times the technical support case data was accessed;
    predict a usage frequency of the system state information for an upcoming time period using one or more machine learning models;
    determine, based at least in part on the usage frequency, a compression level for storage of the system state information; and
    apply the compression level to the system state information to generate at least one compressed file for transmission to a database.

2. The apparatus of claim 1, the plurality of factors further comprising two or more of a device type, a component type, an alert type corresponding to collection of the system state information and a collection type of the system state information.

3. The apparatus of claim 2 wherein the technical support case data further comprises data identifying at least one of when a technical support case was opened, when the technical support case was reopened and a number of times the technical support case was reopened.

4. The apparatus of claim 2 wherein, in predicting the usage frequency of the system state information, the at least one processing device is configured to apply the plurality of factors to a plurality of decision trees, wherein one or more of the plurality of factors comprise one or more nodes of the plurality of decision trees.

5. The apparatus of claim 4 wherein the plurality of decision trees comprise a plurality of gradient boost decision trees.

6. The apparatus of claim 2 wherein, in predicting the usage frequency of the system state information, the at least one processing device is configured to:
  predict a usage frequency of the system state information for respective ones of the plurality of factors; and
  combine the usage frequencies of the system state information for the respective ones of the plurality of factors using multiple linear regression;
  wherein the compression level for storage of the system state information is determined based at least in part on the combined usage frequencies.

7. The apparatus of claim 2 wherein the at least one processing device is configured to train the one or more machine learning models using a training dataset comprising observed usage frequency of system state information for a plurality of devices, the system state information for the plurality of devices comprising data identifying the plurality of factors for respective ones of the plurality of devices.

8. The apparatus of claim 7 wherein, in training the one or more machine learning models, the at least one processing device is configured to:
  compute an initial predicted usage frequency value for the plurality of devices; and
  compute residual usage frequency values for respective ones of the plurality of devices based, at least in part, on a difference between observed usage frequency values for respective ones of the plurality of devices and the initial predicted usage frequency value.

9. The apparatus of claim 8 wherein, in training the one or more machine learning models, the at least one processing device is further configured to:
  compute sums of squares of the residual usage frequency values for respective ones of the plurality of factors for the plurality of devices; and
  identify a minimum one of the sums of squares of the residual usage frequency values for the respective ones of the plurality of factors for the plurality of devices.

10. The apparatus of claim 9 wherein, in training the one or more machine learning models, the at least one processing device is further configured to specify one or more root nodes of one or more decision trees based, at least in part, on one or more of the minimum ones of the sums of squares of the residual usage frequency values.

11. The apparatus of claim 10 wherein the at least one processing device is configured to predict the usage frequency of the system state information corresponding to the one or more devices by applying a learning rate to respective residual usage frequency values determined by the one or more decision trees.

12. The apparatus of claim 1 wherein the at least one processing device is configured to train the one or more machine learning models using a gradient boost for regression algorithm.

13. The apparatus of claim 1 wherein the at least one processing device is configured to:
  iteratively predict the usage frequency of the system state information using the one or more machine learning models;
  determine, based on at least one iteratively predicted usage frequency, that the compression level be changed to a different compression level for storage of the system state information; and
  apply the different compression level to the system state information to generate at least one new compressed file for transmission to the database.

14. A computer program product comprising a non-transitory processor-readable storage medium having stored therein program code of one or more software programs, wherein the program code when executed by at least one processing device causes the at least one processing device to perform steps of:

receiving system state information corresponding to one or more devices, wherein the system state information comprises data identifying a plurality of factors including at least technical support case data, wherein the technical support case data comprises at least data identifying a number of times the technical support case data was accessed;

predicting a usage frequency of the system state information for an upcoming time period using one or more machine learning models;

determining, based at least in part on the usage frequency, a compression level for storage of the system state information; and applying the compression level to the system state information to generate at least one compressed file for transmission to a database.

15. The computer program product of claim 14, the plurality of factors further comprising two or more of a device type, a component type, an alert type corresponding to collection of the system state information and a collection type of the system state information.

16. The computer program product of claim 15 wherein, in predicting the usage frequency of the system state information, the program code when executed by the at least one processing device causes the at least one processing device to perform the step of applying the plurality of factors to a plurality of decision trees, wherein one or more of the plurality of factors comprise one or more nodes of the plurality of decision trees.

17. The computer program product of claim 15 wherein the program code when executed by the at least one processing device causes the at least one processing device to perform the steps of:

predicting a usage frequency of the system state information for respective ones of the plurality of factors; and combining the usage frequencies of the system state information for the respective ones of the plurality of factors using multiple linear regression;

wherein the compression level for storage of the system state information is determined based at least in part on the combined usage frequencies.

18. A method comprising:

receiving system state information corresponding to one or more devices, wherein the system state information comprises data identifying a plurality of factors including at least technical support case data, wherein the technical support case data comprises at least data identifying a number of times the technical support case data was accessed;

predicting a usage frequency of the system state information for an upcoming time period using one or more machine learning models;

determining, based at least in part on the usage frequency, a compression level for storage of the system state information; and applying the compression level to the system state information to generate at least one compressed file for transmission to a database;

wherein the method is performed by at least one processing device comprising a processor coupled to a memory.

19. The method of claim 18, the plurality of factors further comprising two or more of a device type, a component type, an alert type corresponding to collection of the system state information and a collection type of the system state information.

20. The method of claim 19 wherein predicting the usage frequency of the system state information comprises applying the plurality of factors to a plurality of decision trees, wherein one or more of the plurality of factors comprise one or more nodes of the plurality of decision trees.

* * * * *